United States Patent
Belyansky et al.

(10) Patent No.: US 11,222,820 B2
(45) Date of Patent: Jan. 11, 2022

(54) SELF-ALIGNED GATE CAP INCLUDING AN ETCH-STOP LAYER

(71) Applicant: International Business Machines Corporation, Armonk, NY (US)

(72) Inventors: Michael P. Belyansky, Halfmoon, NY (US); Marc Bergendahl, Rensselaer, NY (US); Victor W. C. Chan, Guilderland, NY (US); Jeffrey C. Shearer, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/020,412

(22) Filed: Jun. 27, 2018

(65) Prior Publication Data

US 2020/0006137 A1 Jan. 2, 2020

(51) Int. Cl.
| | |
|---|---|
| *H01L 29/66* | (2006.01) |
| *H01L 21/768* | (2006.01) |
| *H01L 21/8238* | (2006.01) |
| *H01L 21/311* | (2006.01) |
| *H01L 21/027* | (2006.01) |

(52) U.S. Cl.
CPC .... *H01L 21/76897* (2013.01); *H01L 21/0276* (2013.01); *H01L 21/31116* (2013.01); *H01L 21/76829* (2013.01); *H01L 21/823842* (2013.01)

(58) Field of Classification Search
CPC ............... H01L 29/6625; H01L 29/518; H01L 23/53295
See application file for complete search history.

(56) References Cited

U.S. PATENT DOCUMENTS

| | | | |
|---|---|---|---|
| 6,214,656 B1 * | 4/2001 | Liaw | H01L 21/76897 257/E21.507 |
| 6,294,449 B1 | 9/2001 | Wu et al. | |
| 6,316,348 B1 | 11/2001 | Fu et al. | |
| 6,939,814 B2 | 9/2005 | Chan et al. | |
| 7,488,690 B2 | 2/2009 | Iyer et al. | |
| 7,977,183 B2 | 7/2011 | Koide et al. | |
| 8,765,613 B2 | 7/2014 | Chang et al. | |
| 9,202,918 B2 | 12/2015 | Xie et al. | |
| 9,214,392 B1 * | 12/2015 | Lu | H01L 21/76832 |
| 2004/0113209 A1 * | 6/2004 | Izuha | H01L 29/6656 257/388 |

(Continued)

OTHER PUBLICATIONS

Gino Giusi et al., "Performance and reliability of strained-silicon nMOSETs with SiN cap layer," IEEE Transactions on Electron Devices, vol. 54, No. 1, 2007, pp. 78-82.

(Continued)

*Primary Examiner* — Trang Q Tran
(74) *Attorney, Agent, or Firm* — Cantor Colburn LLP; Erik Johnson (57) ABSTRACT

According to embodiments of the present invention, a method of forming a self-aligned contact includes depositing an etch-stop liner on a surface of a gate cap and a contact region. A dielectric oxide layer is deposited onto the etch-stop layer. The dielectric oxide layer and the etch-stop liner are removed in a region above the contact region to form a removed region. A contact is deposited in the etched region.

9 Claims, 4 Drawing Sheets

(56) References Cited

U.S. PATENT DOCUMENTS

| | | | |
|---|---|---|---|
| 2008/0064176 A1* | 3/2008 | Chou | H01L 29/6653 |
| | | | 438/303 |
| 2015/0069532 A1 | 12/2015 | Xie et al. | |
| 2016/0035857 A1* | 2/2016 | Leobandung | H01L 29/665 |
| | | | 257/288 |
| 2016/0133623 A1* | 5/2016 | Xie | H01L 29/66545 |
| | | | 257/384 |
| 2019/0096677 A1* | 3/2019 | Xie | H01L 29/41791 |
| 2019/0355672 A1 | 11/2019 | Fujita et al. | |

OTHER PUBLICATIONS

Victor Chan et al., "High speed 45nm gate length CMOSFETs integrated into a 90nm bulk technology incorporating strain engineering," International,Electron Devices Meeting, IEDM'03, 2003, 3.8, 4 pages.

List of IBM Patents or Patent Applications Treated as Related; Date Filed: Nov. 25, 2019, 2 pages.

\* cited by examiner

* # SELF-ALIGNED GATE CAP INCLUDING AN ETCH-STOP LAYER

BACKGROUND

The present invention relates in general to fabrication methods and resulting structures semiconductor devices. More specifically, the present invention relates to fabrication methods and resulting structures for a self-aligned gate cap including an etch-stop layer.

Integrated circuits can include a large number of circuit elements such as transistors. While significant progress has been made over recent decades with respect to increased performance and reduced feature size of circuit elements, there is an ongoing demand for enhanced functionality of electronic devices, a continuous desire to reduce the dimensions of the circuit elements, and a desire to continue to increase the operating speed of the circuit elements.

With continuous transistor scaling, gate-to-drain and gate-to-source capacitance increases due to the increased proximity of the source and drain metallization contacts (vias) to the gate conductor. For instance, the distance between the contact via and the gate conductor can be as little as 40 nanometers or less in dense logic circuits. With misalignment of the contact via with respect to the gate, the spacing between the gate and the via can be significantly less than 40 nanometers. To make matters worse, due to Miller effect, the capacitance between the gate and drain via is multiplied by the gain of the complementary metal oxide semiconductor stage.

As a result, the total gate-to-drain and gate-to-source capacitance becomes a significant portion of the overall load capacitance for fast, lightly loaded semiconductor circuits with transistors fabricated, for example, in 7 nm technology and below. By reducing the total gate-to-drain and gate-to-source capacitance, a significant leverage in increasing circuit speed can be realized.

SUMMARY

According to an embodiment of the present invention, a self-aligned gate cap includes a gate located on a substrate, a gate cap surrounding a side of the gate and located on a top surface of the gate opposite the substrate, a contact region self-aligned to the gate, and a dielectric oxide located on top of the gate. An etch-stop layer is located in between the dielectric oxide and the top surface of the gate cap.

According to an embodiment of the present invention, a method of forming a self-aligned contact includes depositing an etch-stop liner on a surface of a gate cap and on a contact region, depositing a dielectric oxide layer onto the etch-stop layer, removing the dielectric oxide layer in a region above the contact region, removing the etch-stop layer in the region above the contact region to form a removed region, and depositing a contact in the etched region.

DETAILED DESCRIPTION

It is understood in advance that, although this description includes a detailed description of the formation and resulting structures for a specific FET architecture, implementation of the teachings recited herein are not limited to a particular type of FET or IC architecture. Rather embodiments of the present invention are capable of being implemented in conjunction with any other type of FET or IC architecture, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Integrated circuits can include field effect transistors (FETs) that can be operated in a switched mode, where these devices can exhibit a highly conductive state (on-state) and a high impedance state (off-state). The state of the field effect transistor can be controlled by a gate electrode, which controls, upon application of an appropriate control voltage, the conductivity of a channel region formed between a drain region and a source region.

In order to connect the circuit elements formed in the semiconductor material with the metallization layers, a vertical contact structure can be provided having a first end that can be connected to a respective contact region of a circuit element, such as one or both of a gate electrode and the drain and source regions of transistors, and a second end that can be connected to a respective metal line in the metallization layer by a conductive via.

In some applications, the second end of the contact structure can be connected to a contact region of a further semiconductor-based circuit element, in which case the interconnect structure in the contact level can also be referred to as a local interconnect. The contact structure can include contact elements having a generally square-like or round shape that can be formed in an interlayer dielectric material, which in turn encloses and passivates the circuit elements. As the critical dimensions of the circuit elements in the device level are decreased, the dimensions of metal lines, vias, and contact elements are also reduced.

Self-aligned gates can be used to mitigate the need to apply photolithography techniques to align the gate electrode to the source and drain regions of metal oxide semiconductor transistors during the fabrication process. With self-aligned gates the parasitic overlap capacitances between gate and source, and gate and drain are substantially reduced, leading to metal oxide semiconductor transistors that are faster, smaller, and more reliable than transistors made without them. As technology trends towards smaller transistors, the dimensions of the relative features continues to decrease. This reduction can result in a decrease in spacer thickness, ultimately resulting in an increase in contact leakage and an increase in the contact-gate capacitance.

Embodiments of the invention address the shortcomings of the prior art by providing fabrication methods and resulting structures in which the above-described leakage is mitigated by providing an etch-stop liner 100 (shown in FIG. 2) that is deposited before depositing a dielectric oxide layer 62 (shown in FIG. 3) in which a contact trench 46 (shown in FIG. 4) will be formed. The etch-stop liner 100 has at least one of the benefits of increasing the space between the contact region and the gate 20, reducing the leakage between the contact region and the gate 20, reducing the gate capacitance, or providing an additional etch process margin during formation. In addition, as the etch-stop liner 100 is deposited as a distinct step from the gate cap 30 deposition, the etch-stop liner 100 can be a higher quality material, for example, having an increased density with respect to the material of the gate cap 30.

FIGS. 1-6 illustrate various self-aligned gate cap structures after fabrication operations have been performed in accordance with embodiments of the present invention. The self-aligned gate cap structure shown in the figures represents selected portion of an FET that uses self-aligned fabrication processes to form a contact to an active region of the FET (e.g., an epitaxially grown source or drain (S/D) region). The novel aspects of the invention can be applied to a wide range of planar and non-planar FET architectures that utilize the self-aligned fabrication processes to form a contact.

Figure 1:
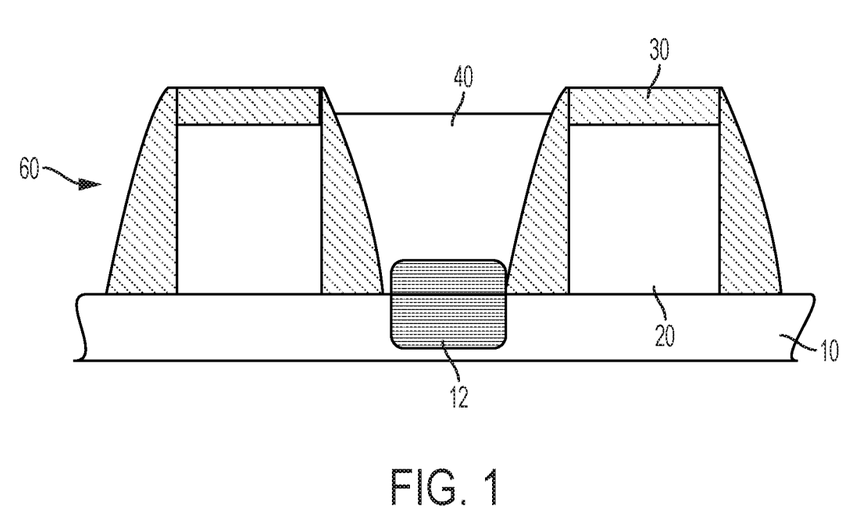
FIG. 1 is a cross-sectional view of a self-aligned gate cap structure after initial fabrication operations according to embodiments of the invention.

In FIG. 1, known fabrication operations have been used to fabricate a self-aligned gate cap structure configured and arranged as shown. The self-aligned gate cap structure shown in FIG. 1 includes semiconductor substrate 10, epitaxial layer 12, gate 20, cap 30, and trench region 40.

Figure 2:
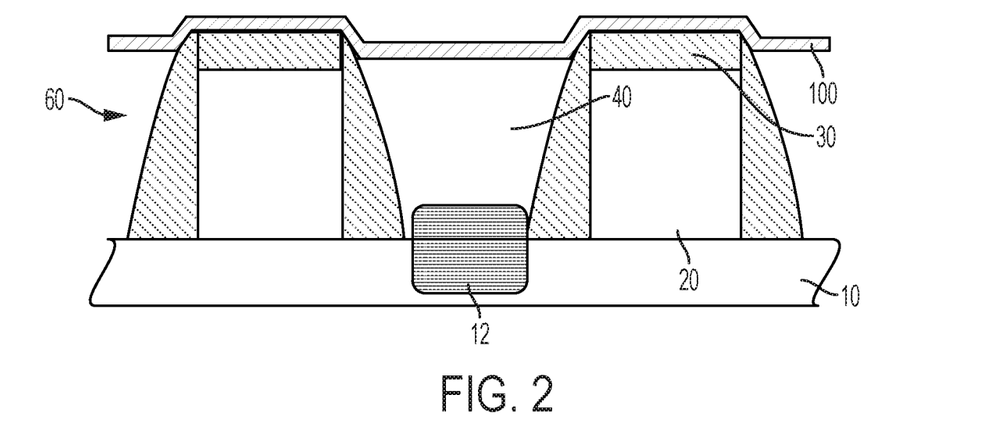
FIG. 2 is a cross-sectional view of the self-aligned gate cap structure after deposition of an etch-stop layer according to embodiments of the invention.

In FIG. 2, known fabrication operations have been used to deposit a protective etch stop liner 100. In embodiments of the invention, the etch stop liner can be deposited conformally using, for example, an atomic layer deposition (ALD) process. In embodiments of the invention, the protective etch stop layer 100 can be formed from a nitride material. Etch-stop layer 100 is located in between second dielectric oxide layer 62 and gate cap 30. The etch-stop layer 100 can include an oxide, a nitride, an oxynitride, a carbide, an oxycarbide, or a combination including at least one of the foregoing. The etch-stop layer 100 can include aluminum oxide, aluminum nitride, aluminum oxynitride, silicon carbide, silicon oxycarbide, or a combination including at least one of the foregoing. Specifically, the etch-stop layer 100 can include silicon nitride (SiN). A density of the etch-stop layer 100 can be greater than or equal to 2.5 g/cm$^3$, more specifically, greater than or equal to 2.7 g/cm$^3$ is preferred. The density of the etch-stop layer is typically less than 3.1 g/cm$^3$. A density of the etch-stop layer 100 can be greater than a density of the gate cap 30. For example, a density of the etch-stop layer 100 can be greater than or equal to 2.7 g/cm$^3$ and a density of the gate cap 30 can be less than 2.7 g/cm$^3$; or a density of the etch-stop layer 100 can be greater than or equal to 2.9 g/cm$^3$ and a density of the gate cap 30 can be less than 2.9 g/cm$^3$. The etch-stop layer 100 can have a thickness of 5 to 20 nanometers, specifically, 10 to 15 nanometers.

A method of forming the self-aligned contact including the etch-stop layer 100 can include depositing the etch-stop layer 100 onto a surface of the gate cap 30 and on the contact region 50; depositing a second dielectric oxide layer 62 onto the etch-stop layer 100; removing the second dielectric oxide layer 62 in the region above the contact region 50; removing the etch-stop layer 100 in the region above the contact region 50; and depositing a contact in the etched region.

Figure 3:
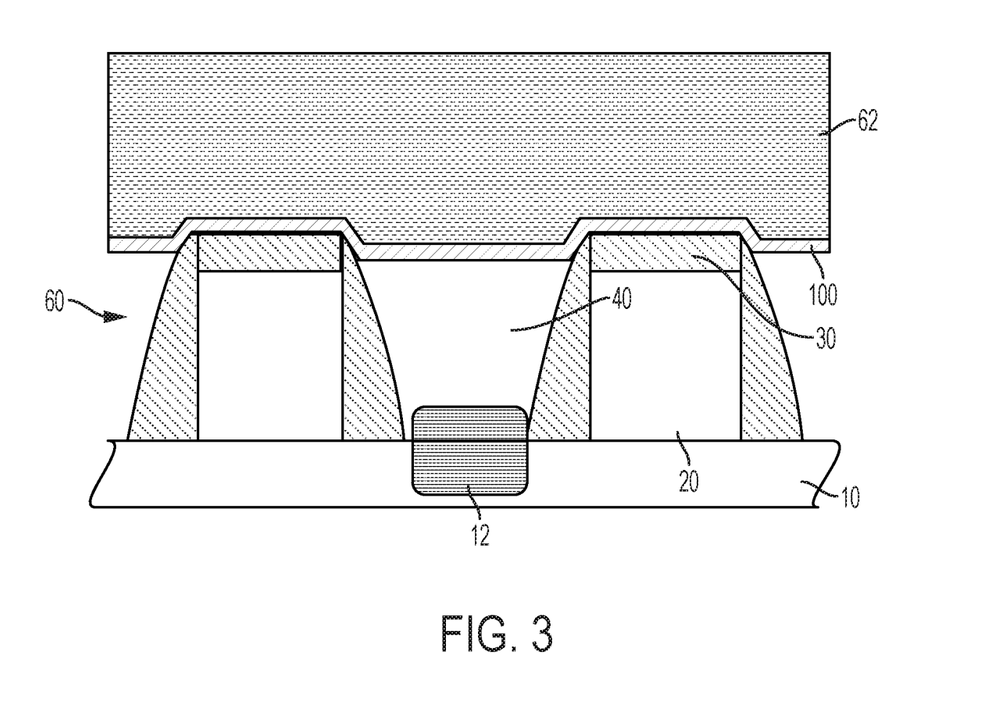
FIG. 3 is a cross-sectional view of the self-aligned gate cap structure after deposition of a dielectric oxide layer on the etch-stop layer according to embodiments of the invention.

FIG. 2 illustrates that etch-stop layer 100 is deposited onto a surface of gate cap 30 and on trench region 40. The etch-stop layer 100 can be deposited by chemical vapor deposition or by spin coating. FIG. 3 illustrates that second dielectric oxide layer 62 is deposited onto etch-stop layer 100.

Figure 4:
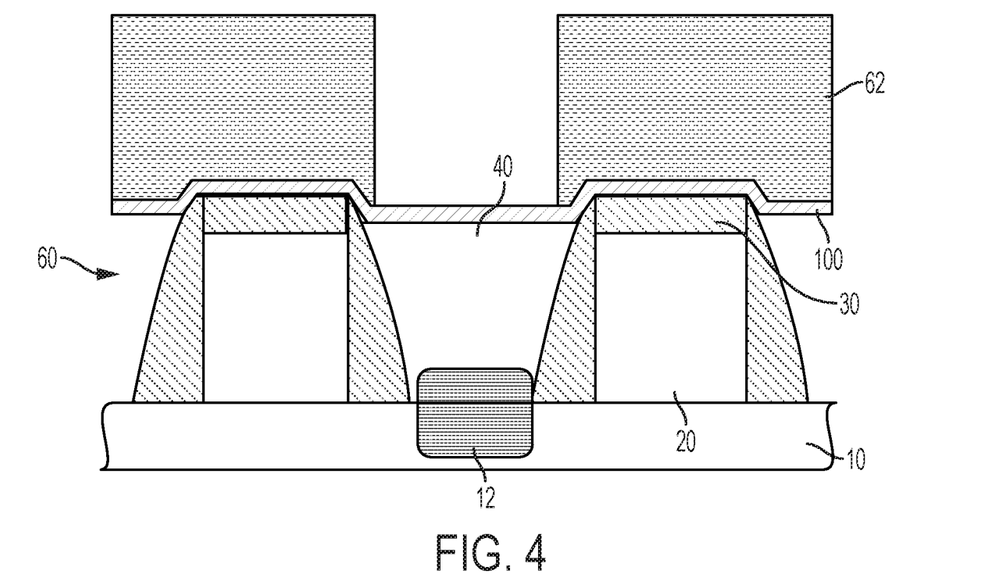
FIG. 4 is a cross-sectional view of the self-aligned gate cap structure after removal of a portion of the dielectric material to form a contact trench according to embodiments of the invention.

FIG. 4 illustrates that a portion of second dielectric oxide layer 62 that is located above trench region 40 is removed to expose etch-stop layer 100. The removing step can include etching, for example, with or without a block mask. Non-limiting examples of suitable etching processes include silicon etching methods selective to oxides. The etching process can be a dry etching process. The etching process can be a directional etching process, such as reactive ion etching, a remote plasma, or chemical vapor/sublimation.

The removal of second dielectric oxide layer 62 can remove second dielectric oxide layer 62 such that a surface of etch-stop layer 100 opposite semiconductor substrate 10 is exposed. An unremoved portion of second dielectric oxide layer 62 that was masked can remain.

Figure 5:
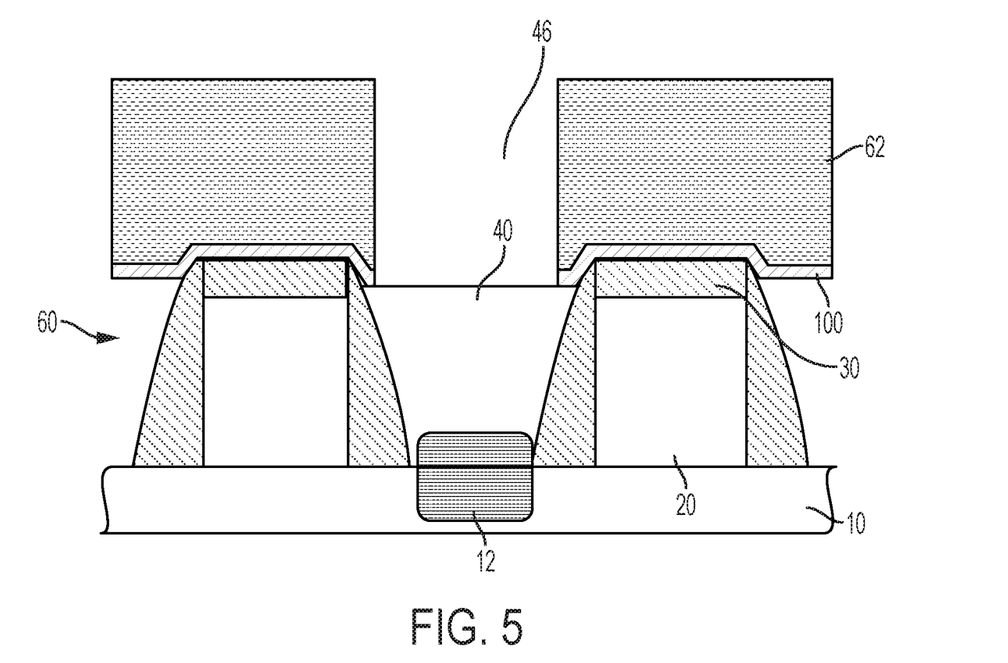
FIG. 5 is a cross-sectional view of the self-aligned gate cap structure after a portion of the etch-stop layer has been removed according to embodiments of the invention.

FIG. 5 illustrates that a portion of etch-stop layer 100 that is located above trench region 40 is removed to form removed region 46 and to expose a surface of trench region 40. The removing step can include etching, for example, with or without a block mask. Non-limiting examples of suitable etching processes include etching methods selective to the material of the etch-stop layer, for example, selective to a nitride layer. The etching process can be a dry etching process. The etching process can be a directional etching process, such as reactive ion etching, a remote plasma, or chemical vapor/sublimation.

Figure 6:
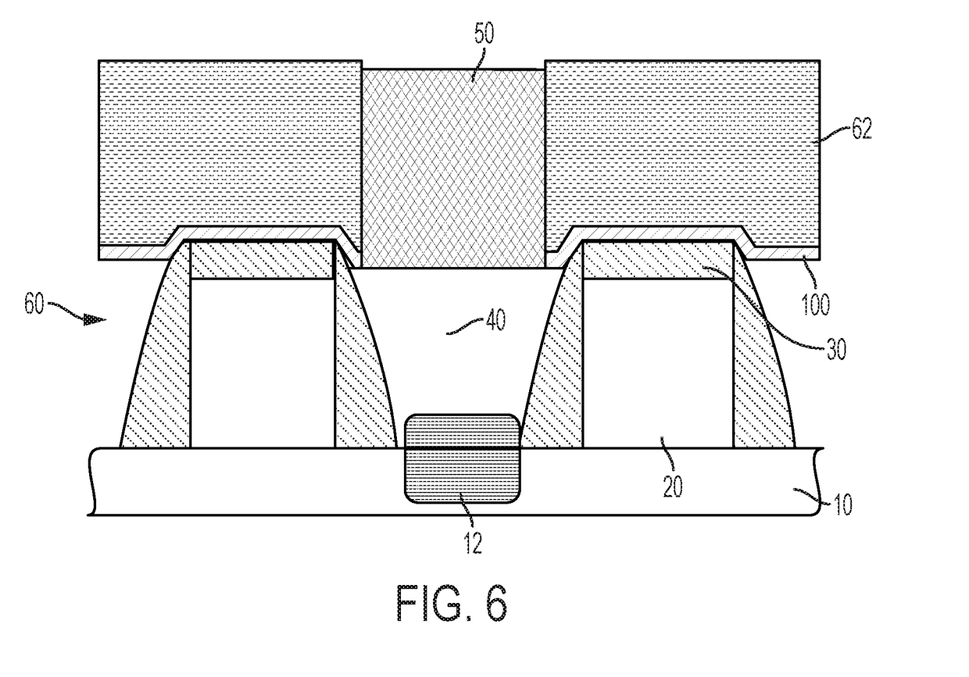
FIG. 6 is a cross-sectional view of the self-aligned gate cap structure after a contact has been deposited in the contact trench according to embodiments of the invention.

FIG. 6 illustrates that contact region 50 can be deposited in the removed region 46. The contact regions 50 can provide an electrical connection with an active region of the semiconductor substrate 10 (such as a source or a drain) to a second component located above the surface. The contact region 50 can be formed by filling the removed region 46 with a conductive material, such as a metal (for example, including tungsten, titanium, aluminum, or a combination including at least one of the foregoing, specifically, tungsten). The conductive material can include tungsten silicide.

A liner material can be deposited in the removed region 46 prior to deposition of the conductive material. The liner material can therefore be located in between trench region 40 and the conductive material and can be located in between second dielectric oxide layer 62 and the conductive material. The liner material can include a metal nitrate. The liner material can include titanium aluminum nitride or titanium nitrate.

The surface of the self-aligned contact can be polished, for example, to planarize the surface of contact region 50 and second dielectric oxide layer 62. The polishing can be accomplished, for example, by chemical and mechanical polishing.

Semiconductor substrate 10 can include a semiconducting material. Semiconductor substrate 10 can include silicon, germanium, carbon, gallium, arsenic, indium, phosphorus, a remaining Group III or V compound, or a combination including at least one of the foregoing. Examples of semiconducting materials include silicon (Si), germanium (Ge), silicon germanium (SiGe), silicon carbide (SiC), silicon germanium carbon (SiGeC), gallium (Ga), gallium arsenide (GaAs), indium arsenide (InAs), and indium phosphide (InP). Semiconductor substrate 10 can include an organic semiconductor or a layered semiconductor such as Si/SiGe, a semiconductor-on-insulator (such as silicon-on-insulator or a SiGe-on-insulator).

Semiconductor substrate 10 can be doped or undoped or can contain doped and undoped regions therein. Semiconductor substrate 10 can include a first doped region (n- or p-), and a second doped region (n- or p-). The first doped region and the second doped region can be the same, or they can have different conductivities and/or doping concentrations. These doped regions are known as "wells".

Epitaxial layer 12 can be located on at least a portion of semiconductor substrate 10. For example, the figures illustrate that epitaxial layer 12 can be located on a surface of semiconductor substrate 10 in between semiconductor substrate 10 and contact region 40. The epitaxial layer can include the same or different material as the semiconductor substrate 10, provided it is epitaxially grown to form a single crystal. In some embodiments of the invention, the epitaxial layer 12 is an active region to which a contact needs to made, for example, a S/D region of an FET.

A gate dielectric layer, not shown, can be formed on the surface of semiconductor substrate 10. The gate dielectric layer can be formed by a thermal growing process such as, for example, oxidation, nitridation, or oxynitridation. Alternatively, the gate dielectric layer can be formed by a deposition process such as, for example, chemical vapor deposition (CVD), plasma-assisted CVD, atomic layer deposition (ALD), evaporation, reactive sputtering, chemical solution deposition or other like deposition processes. The physical thickness of the gate dielectric layer can be 0.5 to 10 nanometers, specifically, 0.5 to 3 nanometers.

The gate dielectric layer can include an insulating material including, but not limited to an oxide, nitride, oxynitride, a silicate (for example, a metal silicate or a nitrided metal silicate), or a combination including at least one of the foregoing. The gate dielectric layer can include an oxide such as, silicon dioxide ($SiO_2$), hafnium dioxide ($HfO_2$), zirconium dioxide ($ZrO_2$), aluminum oxide ($Al_2O_3$), titanium dioxide ($TiO_2$), lanthanum oxide ($La_2O_3$), strontium titanate ($SrTiO_3$), lanthanum aluminate ($LaAlO_3$), or a combination including at least one of the foregoing.

One or more gates 20 can be located on semiconductor substrate 10. The gate 20 can include one or more layers of each independently including silicon, aluminum, carbon, nitrogen, titanium, tantalum, tungsten, germanium, or a combination including at least one of the foregoing. For example, the one or more layers can each independently include titanium (Ti), titanium nitride (TiN), titanium-aluminum (TiAl), titanium aluminum nitride (TiAlN), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi), tungsten, or a combination including at least one of the foregoing.

The gate 20 can include three or more layers (not shown). For example, the gate can include a lower gate portion, an upper gate portion, and a middle layer located in between the lower gate portion and the upper gate portion. The lower gate portion can include a work function metal (such as aluminum carbide, titanium aluminide, or titanium aluminum carbide). The upper gate portion can include tungsten, titanium, aluminum, or a combination including at least one of the foregoing. Specifically, the upper gate portion can include tungsten.

The middle layer can act as a barrier between the lower gate portion and the upper gate portion. The middle gate layer can include a metal nitrate. For example, the middle gate layer can include at least one of titanium aluminum nitride or titanium nitrate (TiN), specifically, titanium nitrate.

The gate material can be doped, for example, by an in-situ doping deposition process, ion implantation, or annealing. The gate material can be doped with As, P, B, Sb, Bi, In, Al, Ga, Ti, or a combination including at least one of the foregoing. The dopant can be present in the gate material in an amount of $1\times10^{14}$ to $1\times10^6$ atoms per centimeters squared (atoms/cm$^2$), specifically, $1\times10^{15}$ to $5\times10^{15}$ atoms per centimeters squared.

The gate material that forms the gate 20 can be deposited, for example, by physical vapor deposition, chemical vapor deposition, or evaporation.

The thickness, i.e., height, of the gates 20 can be 20 to 180 nanometers, specifically, 40 to 150 nanometers. The 20 gate can have a thickness of less than or equal to 10 nanometers, specifically, of 3 to 8 nanometers. The lower gate portion and the upper gate portion can each independently have a thickness of 0.5 to 7 nanometers, specifically, 0.5 to 2 nanometers. The middle layer can have a thickness of 1 to 7 nanometers, specifically, 2 to 5 nanometers.

Cap 30 (also referred to herein as the gate cap) is located on the gate 20 and can reduce one or both of the gate-to-drain or the gate-to-source capacitance. Cap 30 can be located on one or both of the side walls of the gate 20 and an upper surface opposite from semiconductor substrate 10.

Cap 30 can be an insulator and can include a cap material such as an oxide, a nitride, an oxynitride, or a combination including at least one of the foregoing. Specifically, cap 30 can include silicon nitride (SiN). A density of the cap material can be 2.5 to less than 3.1 g/cm$^3$.

Cap 30 can be formed by a deposition process, such as a by using a high density plasma, and optionally followed by polishing, for example, by chemical and mechanical polishing to planarize the surface. A width of cap 30 on the side walls of the gate 20 can be 15 to 80 nanometers. A height of cap 30 located on top of gate 20 can be 1 to 20 nanometers, specifically, 1 to 10 nanometers, specifically, 5 to 15 nanometers.

TS (trench silicon) or trench region 40 can be located in between two or more gates 20. The trench regions 40 can be formed by forming a trench in between gate structures and filling the trench with a conductive material, such as a metal (for example, including tungsten, titanium, aluminum, or a combination including at least one of the foregoing, specifically, tungsten). The conductive material can include tungsten silicide.

A liner material can be deposited in the trench prior to deposition of the conductive material. The liner material can therefore be located in between gate cap 30 and the conductive material and can be located in between semiconductor substrate 10 and the conductive material. The liner material can include a metal nitrate. The liner material can include titanium aluminum nitride or titanium nitrate.

The gates 20 can be located in one or more interlayer dielectric layers. For example, FIG. 6 illustrates that first dielectric oxide layer 60 is located on semiconductor substrate 10 and that second dielectric oxide layer 62 is located on first dielectric oxide layer 60. The dielectric layers can each independently be deposited by, for example, chemical vapor deposition, ALD, or PECVD. The thickness of the dielectric layers can each independently be 10 to 500 nanometers.

At least a portion of the dielectric oxide layers can each independently include a low dielectric constant oxide having a dielectric constant of less than 3.9, specifically, 2.5 to 3.8, more specifically, 2.8 to 3.5. The low dielectric constant material can be a porous oxide material. The porous oxide material can have a porosity of greater than 0, for example, 0.01 to 0.6. The porous oxide material can include a porous silicon dioxide. The porous silicon dioxide can be formed by depositing a silicon carbide, etching the silicon carbide to form a porous silicon carbide, and oxidizing to form the porous silicon dioxide.

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A self-aligned gate cap comprising:
   a gate located on a substrate;
   a dielectric gate cap comprising a first portion in direct contact with a sidewall of the gate and a second portion located on a top surface of the gate opposite the substrate, the dielectric gate cap comprising a density of less than 2.7 g/cm$^3$;
   a trench silicide region adjacent to the first portion of the gate cap, the trench silicide region on the substrate, the trench silicide region disposed in a trench, wherein the trench silicide region comprises sidewalls defined by the first portion of the gate cap, and wherein the trench silicide region comprises a topmost surface positioned above the top surface of the gate;
   a contact region self-aligned to the gate, the contact region positioned on the topmost surface of the trench silicide region, such that an interface between the trench silicide region and the contact region is between the top surface of the dielectric gate cap and the top surface of the gate;

a dielectric oxide located on top of the gate; and an etch-stop layer located in between the dielectric oxide and the gate cap, the etch-stop layer positioned directly on a sidewall of the first portion of the gate cap and a top surface of the second portion of the gate cap, the etch-stop layer comprising a conformal portion that extends over and in direct contact with the top surface of the trench silicide region, the etch-stop layer comprising a density of greater than or equal to 2.7 g/cm$^3$.

2. The self-aligned gate cap of claim 1, wherein the etch-stop layer comprises an oxide, a nitride, an oxynitride, or a combination thereof.

3. The self-aligned gate cap of claim 1, wherein the etch-stop layer has a thickness of about 5 nm to about 20 nm.

4. The self-aligned gate cap of claim 1, wherein the etch-stop layer has a density of greater than or equal to about 2.5 g/cm$^3$.

5. The self-aligned gate cap of claim 1, wherein the gate cap has a density of about 2.5 to less than 3.1 g/cm$^3$.

6. The self-aligned gate cap of claim 1, wherein the gate cap located on the top surface of the gate has a thickness of about 1 nm to about 20 nm.

7. The self-aligned gate cap of claim 1, wherein the gate cap comprises an oxide, a nitride, an oxynitride, or a combination thereof.

8. The self-aligned gate cap of claim 1, wherein the gate comprises one or more layers of each independently comprising silicon, aluminum, carbon, nitrogen, titanium, tantalum, tungsten, germanium, or a combination thereof.

9. The self-aligned gate cap of claim 1, wherein the gate cap comprises an oxide, a nitride, an oxynitride, or a combination thereof.

* * * * *